United States Patent [19]

Nakazawa et al.

[11] 4,266,876
[45] May 12, 1981

[54] AUTOMATIC ALIGNMENT APPARATUS

[75] Inventors: Kiwao Nakazawa, Tokyo; Akikazu Tanimoto, Kawasaki, both of Japan

[73] Assignee: Nippon Kogaku K.K., Tokyo, Japan

[21] Appl. No.: 891,301

[22] Filed: Mar. 29, 1978

[30] Foreign Application Priority Data

Mar. 31, 1977 [JP] Japan ................................. 52-35415

[51] Int. Cl.³ ...................... G01B 11/00; G01B 11/14; G02B 27/17
[52] U.S. Cl. ................................. 356/400; 250/236; 350/6.8; 356/375
[58] Field of Search ............... 356/152, 372, 375, 380, 356/399–400; 250/203, 234–236, 548; 350/6.1–6.91, 285; 340/146.3 F

[56] References Cited

U.S. PATENT DOCUMENTS

| | | | |
|---|---|---|---|
| 3,345,912 | 10/1967 | Lohmann | 350/6.4 |
| 3,535,527 | 10/1970 | Beall, Jr. | 250/202 |
| 3,549,805 | 12/1970 | Cannon, Jr. | 350/6.91 |
| 3,739,247 | 6/1973 | Yamaguchi et al. | 356/400 |
| 3,776,995 | 12/1973 | Little, Jr. | 350/285 |
| 3,818,444 | 6/1974 | Connell | 350/6.8 |
| 3,955,072 | 5/1976 | Johannsmeier et al. | 356/400 |
| 3,989,385 | 11/1976 | Dill et al. | 356/152 |
| 4,103,998 | 8/1978 | Nakazawa et al. | 250/237 G |
| 4,153,371 | 5/1979 | Koizumi et al. | 356/400 |

FOREIGN PATENT DOCUMENTS 887031  11/1943  France ..................................... 250/234

*Primary Examiner*—John K. Corbin
*Assistant Examiner*—Wm. H. Punter
*Attorney, Agent, or Firm*—Shapiro and Shapiro

[57] ABSTRACT

An alignment apparatus for bringing two objects, each having at least one reference mark, into a predetermined positional relation is disclosed in which the two objects are scanned by a beam of light emitted from a coherent light source, the light coming from the reference marks is received and converted into electrical signals by means of which the amount of deviation between the two objects is detected and the two objects are adjusted to the predetermined positional relation. Repetitively swept light from the light source is divided into two parts which scan the reference marks at different times and along different directions.

16 Claims, 8 Drawing Figures

AUTOMATIC ALIGNMENT APPARATUS

BACKGROUND OF THE INVENTION

1. Field of the Invention

The present invention relates to an alignment apparatus using a coherent light source such as laser. More particularly, the present invention relates to an automatic alignment apparatus suitably used in manufacturing integrated circuit elements and the like to carry out an alignment of a mask and a wafer when a circuit pattern is printed on the wafer through the mask.

2. Description of the Prior Art

According to a known automatic alignment method, two alignment marks are usually provided on each of the wafer and the mask so that a predetermined positional relation may be obtained when the mask is laid on the wafer. When the mask is laid on the wafer, the relative positional deviation of these alignment marks from the predetermined position is detected and, depending on the detected deviation, a servo mechanism is controlled to reduce the deviation. The servo mechanism thus controlled moves the mask or the wafer so as to bring them into the predetermined positional relation.

As will be seen from the above, in the known alignment method it is impossible to increase the accuracy of automatic alignment over the accuracy of detection of the position of the alignment marks, since the former is limited by the latter.

In the method for detecting such alignment marks hitherto used, alignment marks overlapping each other are magnified through an optical system and the image in the magnified image plane is converted into an electrical signal by use of a combination of an image detector, a scanning slit and a detecting element. The electrical signal is further processed to obtain the relative positional deviation between the mask and wafer (amount of error). In carrying out this known mark detecting method, the view field of an optical microscope is so illuminated as to have uniform intensity of light over the whole view field. However, it is known that only a small portion of the total quantity of light reflected can be used to actually detect the marks. Therefore, when the contrast of a pattern on the wafer is lowered in the manufacturing process of the integrated circuit elements, the signal-to-noise (S/N) ratio of the photoelectric signal produced based on the light received by the detecting element is markedly reduced and thereby the accuracy of detection of mark position is bound to be deteriorated.

To overcome the above described drawback of the conventional mark detecting method, there has been already proposed an automatic alignment apparatus employing a laser spot scanning system, an embodiment of which is disclosed, for example, in Japanese Patent Application laid open specification No. 12577/1977. According to the newly proposed detecting system, the surfaces of the mask and wafer are scanned by a laser spot of high power intensity and the light scattered by the alignment marks is detected. Therefore, a larger quantity of light can be effectively used for detection of the alignment marks and the accuracy of detection of mark position is improved accordingly.

In the above mentioned patent publication, there is shown and described such an embodiment in which a laser spot scans the mask and the wafer linearly at a uniform velocity to detect the linear alignment marks provided thereon. This embodiment has an advantage in that the scanning laser spot has a broader scanning range compared with an oscillating spot system and therefore it functions properly even when the alignment marks are somewhat apart from the center of the laser spot scanning. However, it has a particular difficulty owing to the fact that the laser spot scans the marks overlapping each other only unidimensionally. In case that the overlapped marks deviate from each other two-dimensionally, a modification is required to measure the amount of error. Namely, it is required that an alignment mark be composed of line segments which are neither parallel nor normal to the scanning direction of the spot and that time intervals of the photoelectric pulses obtained in a time series according to the mark lines be measured and computed so as to obtain the amount of relative positional deviation in two dimensions. Such a scanning method makes the mark position detecting apparatus complicated and increases the possibility of measurement error. For example, in detecting the deviation of position in a coordinate system with x and y axes, there may occur a mutual interference between the x-component and the y-component, so that the amount of deviation in the x direction then detected may include a small portion of deviation in the y direction and vice versa.

SUMMARY OF THE INVENTION

Accordingly, it is an object of the present invention to provide an improved alignment apparatus of the type hereinbefore described, which excludes the possibility of mutual interference as mentioned above.

Another object of the invention is to provide an alignment apparatus which is simple in structure and excellent in accuracy of measurement.

In attaining the above and other objects, the alignment apparatus according to the invention employs reference marks (alignment marks) scanned by a laser spot which is swept linearly at a uniform velocity in two different directions crossing each other, alternately, in a time division manner, and the deviations of the reference marks are measured so as to make the deviation in one direction separate from that in another direction.

According to another feature of the invention, the above mentioned two directions of scanning are directions that cross at right angles to each other, and in the alignment apparatus the beam from which a scanning laser spot is formed is divided into two directions and the divided beams are selectively focused on the reference marks.

In accordance with a further feature of the alignment apparatus of the invention, the amount of deviation between two objects to be aligned is measured in two orthogonal directions (crossing at right angles to each other), and in an angular direction $\theta$.

Since in the alignment apparatus of the invention, the deviation of reference marks in one direction and the deviation in another direction are measured separately from each other from the beginning of measurement, there is completely excluded the possibility of mutual interference between the measurements in two different directions as is the case in the prior art apparatus mentioned above. This is an important achievement of the present invention.

Other features and advantages of the invention will be apparent from the following description when taken in connection with the accompanying drawings.

DESCRIPTION OF PREFERRED EMBODIMENTS

Figure 1:
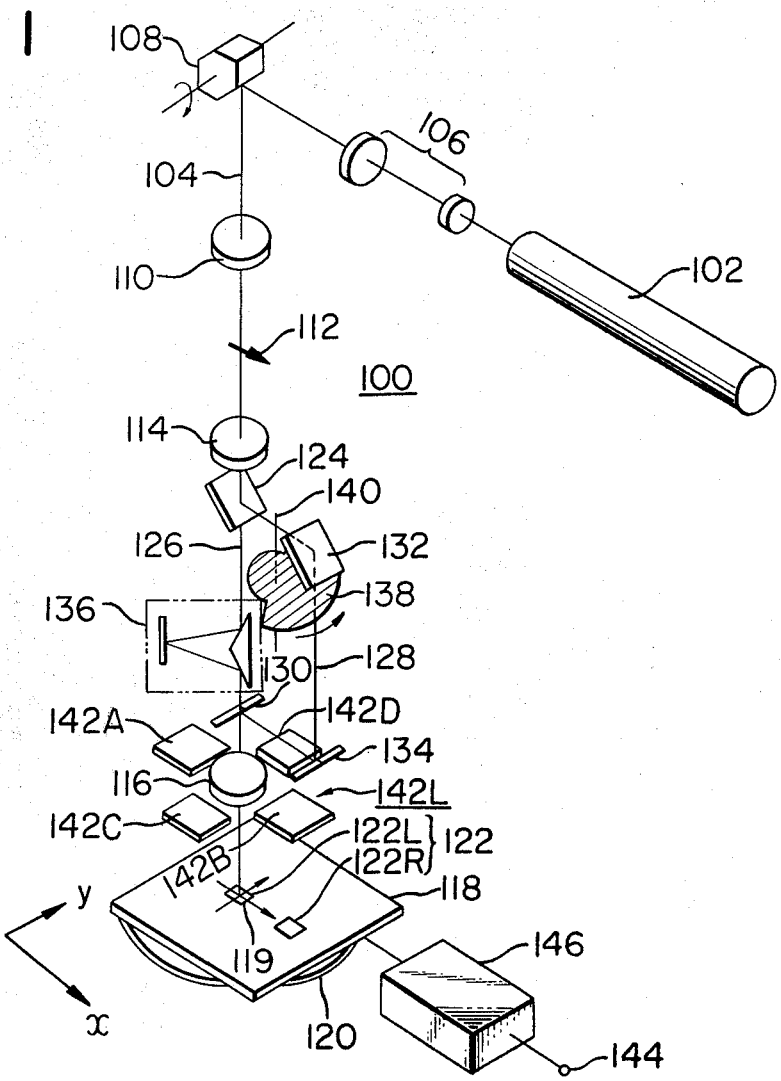
FIG. 1 is a perspective view of an embodiment of an alignment apparatus of the invention.

Referring to FIG. 1, there is shown an arrangement of alignment apparatus 100 according to the invention. In the apparatus 100, a beam of light 104 emitted from a laser 102 is expanded by a beam expander 106, and then deflected and swept by a multi-facetted rotary mirror 108 which rotates at a uniform angular velocity. The deflected beam 104 is incident upon an $f\theta$ lens 110, the focal point at the object side of which is coincident with the deflection point so as to form a fine spot 112 at the focal point at the image side. Thus, the fine spot 112 scans the focal plane linearly at a uniform speed.

It should be noted that the term "$f\theta$ lens" used herein means a lens for focusing any parallel rays which enters at a $\theta$ angle with respect to an optical axis of the lens, on a focal surface of the lens at a position at an $f\theta$ distance from the optical axis wherein f is a focal length of the lens.

A relay lens system comprising lenses 114 and 116 projects a minified image of the fine spot designated by 119 on a mask 118. The mask 118 is of a well-known type used to print a pattern of a circuit on a wafer 120.

The lens 114 is so disposed that its focal point at the object side is coincident with the focal point at the image side of the $f\theta$ lens 110. After passing through the lens 114, the beam 104 is divided into two parts by a beam splitter 124 to travel the optical paths 126 and 128, respectively, the lengths of which are the same. The two parts of the beam are again introduced in the same optical path by another beam splitter 130 after passing the respective optical paths 126 and 128. More particularly, part of the beam reflected by the beam splitter 124 is incident upon the beam splitter 130 through the mirrors 132 and 134, and the beam splitter 130 reflects the incident beam part to the mask. On the other hand, another part of the beam transmitted through the beam splitter 124 is rotated by 90° in its sweeping direction by an image rotator 136 and then directed to the mask after passing through the beam splitter 130. To selectively close or open one of the two optical paths 126 and 128 there is provided in the optical paths a chopper 138 in common to both the optical paths. The chopper 138 rotates about its rotational axis 140 and is so designed as to alternately shut out the optical paths 126 and 128 at equal time intervals. In the embodiment shown in FIG. 1, the rotary mirror 108 is in a form of a regular hexagonal column and therefore the beam 104 is swept six times during one revolution of the mirror 108. The chopper 138 rotates in synchronism with the rotary mirror and closes one of the optical paths 126 and 128 while opening the other during one sweeping period of the beam 104. Since the chopper 138 makes a half turn during one sweeping of the beam 104, it rotates three times during one rotation of the rotary mirror 108.

In this arrangement, when the chopper 138 selects the optical path 128, the spot 119 scans the surface of the mask 118 in the direction of the x axis as viewed in the drawing of FIG. 1. When the chopper 138 selects the optical path 126, the spot 119 scans the surface of the mask in the direction of the y axis, because the beam 104 is rotated by 90° this time by the image rotator 136. In this manner, scanning in the direction of x and in the direction of y is carried out alternately. Thus, during one rotation of the rotary mirror 108, the mask 118 is scanned three times each for the x-direction and for the y-direction.

Figure 2:
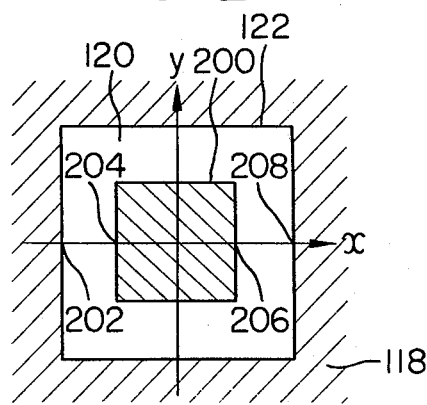
FIG. 2 is a plan view showing in detail the alignment marks provided on a mask and a wafer respectively.

The alignment mark 122 provided on the mask 118 comprises two marks, 122L and 122R in the same form, only one of which is illustrated in FIG. 2 in detail for the sake of simplification of the drawing. As seen from FIG. 2, the alignment mark 122 in this embodiment is made as a square window through which light can pass. The alignment mark 200 provided on the wafer 120 also comprises two marks corresponding to the alignment marks 122 on the mask 118, but only one of which is shown in the drawing of FIG. 2 for the sake of simplification of the drawing. The alignment mark 200, as shown in FIG. 2, is also square in shape and the size of the mark 200 is far smaller than that of the mark 122 on the mask, so that the former may be included wholly in the latter. FIG. 2 shows a plan view of the alignment marks 122 and 200 correctly aligned with each other. As can be seen from FIG. 1, there are at least two pairs of such alignment marks 122 and 200, and the necessary positioning of the mask 118 relative to the wafer 120 can be made by detecting the positional relation between the two pairs of alignment marks.

Figure 3:
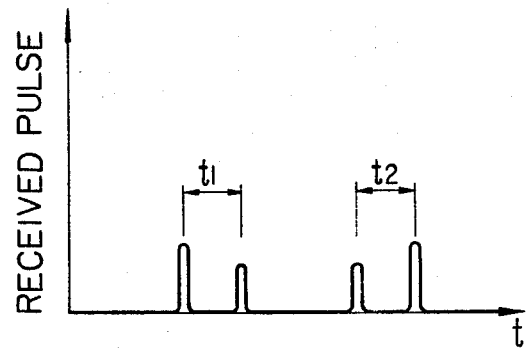
FIG. 3 is a wave form diagram of pulses generated when the light scattered by the alignment marks is received.

When the beam spot 119 scans the alignment marks 122 and 200 in x- or y-direction in a manner as illustrated in FIG. 1, there occurs a scattering of laser light at the edge portion of each mark. The light thus scattered, which is not shown in the drawing for the sake of simplification, is received by a detector 142 disposed in the vicinity of the lens 116 so as to convert the received light into an electrical signal, as illustrated in FIG. 3. The detector 142 comprises two detectors, that is, detector 142L for detecting the mark 122L and detector 142R for the mark 122R. The two detectors are entirely the same in structure and therefore only one of them, that is, the detector 142L is shown in FIG. 1 for the sake of simplification of drawing.

As shown in FIG. 1, the detector 142L comprises four photoelectric elements of conventional type, 142A–142D. Of these four photoelectric elements, two elements 142A and 142B are disposed in the x-direction to receive the scattered light in scanning in the direction of x whereas the other two elements 142C and 142D are disposed in the y-direction to receive the scattered light in scanning in the direction of y. In the first pair of elements in the x-direction, the element 142A is used to receive the light scattered during the first half period of one scanning in the x-direction, namely the light scattered at the edge portions 202 and 204 on the left side of the marks 200 and 122, respectively, as viewed in FIG. 2. The other element 142B receives the light scattered during the second half period of the scanning in the x-direction, namely the light scattered at the edge portions 206 and 208 on the right hand side of the marks 200 and 122. The two elements 142C and 142D in the other pair are used in the same manner in scanning in the direction of y. The arrangement and function of the detector 142R (not shown), which also comprises four photoelectric elements, are entirely the same as those of the above mentioned detector 142L.

Now, the manner of alignment using the above described apparatus will be desribed in outline.

As well-known in the art, there are provided at least two alignment marks 122 and 200 as shown in FIG. 2 on the mask 118 and the wafer 120, respectively. These alignment marks are arranged in such a manner that the marks on the former may be coincident with the marks on the latter in a predetermined alignment position.

As previously mentioned, the marks on the wafer 120 are omitted in FIG. 1 and only the marks 122L and 122R provided on the left and right sides of the mask 118 are seen in FIG. 1. Also, as mentioned, while in FIG. 1 there is shown only the optical system including the detector 142L for the left side mark 122L, it is to be understood that for the right side mark 122R there is also provided another optical system of the same type.

In carrying out an alignment, a preliminary alignment operation is made initially for a relative positioning of the mask 118 and the wafer 120, by which the mark 200 on the wafer 120 comes almost within the mark 122 on the mask 118 as illustrated in FIG. 2. Thereafter, in the above described apparatus 100, the beam spot 119 starts scanning the two marks 122 and 200 in the directions of x and y alternately to measure the relative deviation in position between the marks, that is, the amount of error. In response to the amount of error then measured, a signal is delivered to a terminal 144 which serves to produce a servo signal, so that a mask driving mechanism 146 corrects the position of the mask 118 in accordance with the signal. This operation is repeated until the measured error is reduced to a value falling within a predetermined allowance and a final alignment of the mask relative to the wafer is attained.

Figure 4:
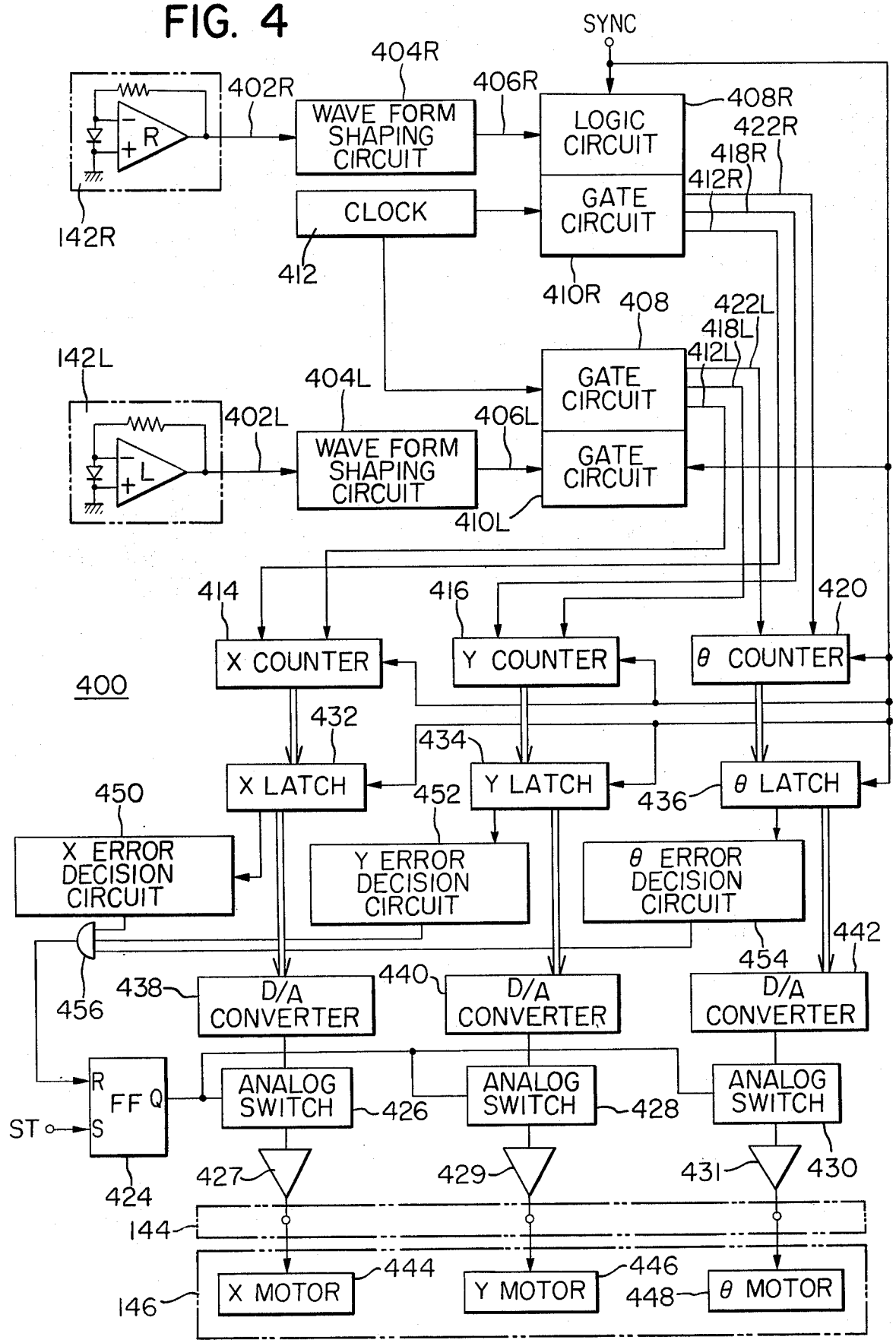
FIG. 4 is a block diagram showing one example of a circuit used to control a mask driving mechanism according to the invention.

FIG. 4 shows one embodiment of an electric circuit 400 for generating a signal in response to the amount of error as described above and controlling the mask driving mechanism 146.

In FIG. 4, two mark detectors, that is, the detector 142R for detecting the right side marks and the detector 142L for the left side marks, are shown. When the right mark detector 142R detects the marks 122 and 200, there is produced on the lead 402R an output that is, for example, a wave form as illustrated in FIG. 3.

Figure 5:
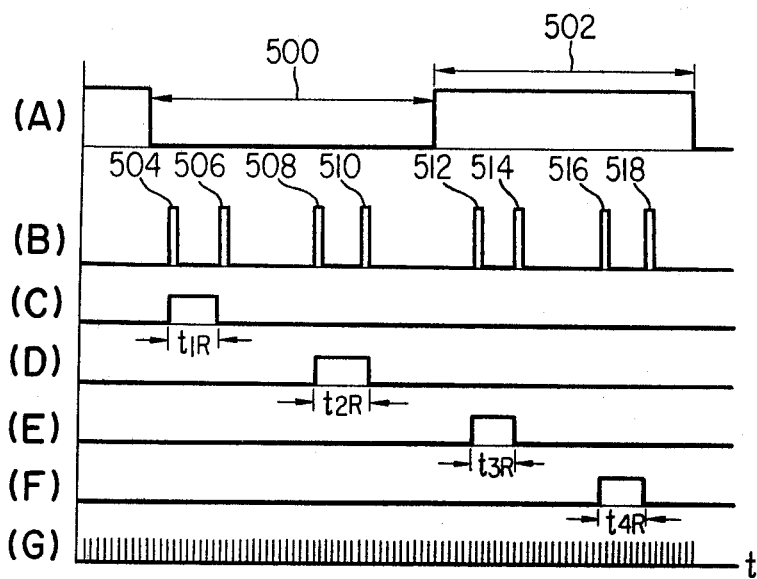
FIG. 5 is a time chart showing signals appearing at various locations in the circuit of FIG. 4.

FIG. 5 is a time chart showing various wave forms of signals at different locations of the circuit of FIG. 4. The wave form in FIG. 5A is of a signal showing the positional phases of the chopper 138. During its portion designated by 500, a scanning in the x-direction is carried out, and the remaining portion designated by 502 shows the phase in which a scanning in the y-direction is carried out.

Since the output wave forms shown in FIG. 3 have some variations in height and width, a wave form shaping circuit 404R shapes these waves into pulses having a predetermined level and width. The shaped wave form appearing on the output lead 406R is shown in FIG. 5B. From the lead 406R, the shaped pulses shown in FIG. 5B are delivered to a logic circuit 408R and a gate circuit 410R. These pulses are combined with a clock signal (FIG. 5G) delivered from a clock 412 and a laser scanning synchronizing signal delivered from a terminal SYNC, and these combined signals are subjected to the following signal processing:

When the beam spot 119 scans the right side marks 122R and 200R in the x- and y-directions one time each, there are produced on the lead 406R pulses shown in FIG. 5B, of which the pulses 504, 506, 508 and 510 are those generated in scanning in the x-direction and the remaining pulses 512, 514, 516 and 518 are those generated in scanning in the y-direction. If there is provided in the circuit a flip-flop which can be set by the pulse 504 and reset by the pulse 506, then there will be obtained a wave form such as illustrated in FIG. 5C. Therefore, by applying this wave form in FIG. 5C and the clock pulses in FIG. 5G to an AND circuit, the width $t_{1R}$ of the wave form in FIG. 5C can be represented by the number of clock pulses passed by the AND circuit (gate). Such pulses are put out on the lead 412R and become representative of the distance ($t_1$ in FIG. 3) between the mark edges 202 and 204 (see FIG. 2). In the same manner, the wave form in FIG. 5D represents the distance between the mark edges 206 and 208 on the other side. Also, the wave forms in FIGS. 5E and 5F are representative of the distances between the edges of the mark 122R and the mark 200R in the direction of y. As can be seen from the above, the amount of error $x_R$ (dimension in length) found in scanning the right side marks 122R and 200R in the direction of x is given by:

$$x_R = v/2(t_{2R} - t_{1R}) \tag{1}$$

wherein $v$ is scanning velocity of the spot 119.

In the same sense, the amount of error $y_R$ in scanning in the direction of y is given by:

$$y_R = v/2(t_{4R} - t_{3R}) \tag{2}$$

Also, as for the left side alignment marks 122L and 200L, the amount of error in scanning of the x-direction $x_L$ and that in scanning of the y-direction $y_L$ are respectively given by:

$$x_L = v/2(t_{2L} - t_{1L}) \tag{3}$$

$$y_L = v/2(t_{4L} - t_{3L}) \tag{4}$$

wherein $t_{1L}$, $t_{2L}$, $t_{3L}$ and $t_{4L}$ are pulse widths representative of the distances between the mark edges of the left side marks.

Therefore, for the conditions that the amount of deviation in the x-direction of the center of the distance between the edge of the left side alignment mark 200L and the edge of the right side mark 200R relative to the center of the distance between the edge of the left side mark 122L and the edge of the right side mark 122R is X and the amount of deviation in the y-direction of the center of the former relative to the center of the latter is Y, there are given:

$$X = \tfrac{1}{2}(x_R + x_L)$$

$$Y = \tfrac{1}{2}(y_R + y_L)$$

Using the above equations (1)–(4):

$$X = v/4(t_{2R} - t_{1R} + t_{2L} - t_{1L}) \tag{5}$$

$$Y = v/4(t_{4R} - t_{3R} + t_{4L} - t_{3L}) \tag{6}$$

Also, provided that the amount of rotation in an angular direction, that is, in the direction of $\theta$ is $\textcircled{H}$ (radian), the following formula is given:

$$\textcircled{H} \doteq 1/l(y_R - y_L)$$

wherein $l$ is distance between the left side alignment and the right side alignment, and the approximate formula of tan $\textcircled{H} \doteq \textcircled{H}$ is used assuming that $\textcircled{H}$ is extremely smaller than 1.

Using the above equations (2) and (4);

$$\textcircled{H} \doteq v/2l(t_{4R} - t_{3R} - t_{4L} + t_{3L}) \tag{7}$$

Returning again to FIG. 4, on the lad 412R leading from the gate circuit 410R to an X counter 414 there appear clock pulses the number of which corresponds to the pulse widths $t_{1R}$ and $t_{2R}$ (FIGS. 5C and 5D) in response to the scanning in the x-direction of the right side marks. On the lead 418R leading to a Y counter 416, there appear clock pulses the number of which corresponds to the pulse widths $t_{3R}$ and $t_{4R}$ (FIGS. 5E and 5F) in response to the scanning of the right side marks in the y-direction. Also, on the lead 422R leading from the gate circuit 410R to a $\textcircled{H}$ counter 420 there appear clock pulses the number of which corresponds to the pulse widths $t_{3R}$ and $t_{4R}$ in response to the scanning of the right side marks in the direction of y. The same also applies to the operations of the circuit 142L–422L disposed for the left side marks.

The above mentioned X counter 414, Y counter 416 and $\textcircled{H}$ counter 420 are all reversible counters. For example, the X counter 414 is so made that it is stepped up by the clock pulses corresponding to pulse widths $t_{2R}$ and $t_{2L}$ and stepped down by the clock pulses corresponding to pulse width $t_{1R}$ and $t_{1L}$. Thus, when both the left side and right side marks are scanned in the direction of x, the X counter 414 steps up or down in a manner mentioned above depending upon the signal appearing on the leads 412R and 412L. Finally, the X counter 414 holds a value of count corresponding to the value of the right side of the formula (5). In the same manner, the Y counter and the $\textcircled{H}$ counter operate in response to the scanning of both the left and right marks in the y-direction and hold values of count corresponding to the values of the right side of the formulae (6) and (7), respectively.

After one x-y scanning is carried out in the above described manner, the flip-flop 424 is set by a start signal given to its terminal ST and thereby the analog switches 426, 428 and 430 connected to the Q output of the flip-flop are actuated. Each value of the count held in the respective counters 414, 416, and 420 is latched in the corresponding one of X latch 432, Y latch 434 and $\textcircled{H}$ latch 436 by a laser scanning synchronizing signal given to the terminal SYNC and then the counters 414, 416 and 420 are cleared accordingly.

The values of count latched in the latch circuits 432, 434 and 436 are converted into analog signals respectively by D/A converters 438, 440 and 442. These error signals X, Y and $\textcircled{H}$ now converted into analog signals enter servo amplifiers 427, 429 and 431 through the actuated analog switches 426, 428 and 430 respectively. The signals amplified by the amplifiers are delivered to the mask driving mechanism 146 (FIG. 1) through the terminal 144 (FIG. 1) and used to drive mask driving motors 444, 446 and 448. In this manner, the mask 118 is moved in the directions of x and y by an amount corresponding to the amounts of error X and Y and also rotated in the direction of $\theta$ by an amount corresponding to the amount of error $\textcircled{H}$.

The above described sequence of operation is repeated until the amounts of error X, Y and $\textcircled{H}$ become smaller than the reference values predetermined therefor respectively. When this is attained, error decision circuits 450 (for X), 452 (for Y) and 454 (for $\textcircled{H}$ ) detect it and actuate the AND gate 456. These error decision circuits 450, 452 and 454 are connected to the latch circuits 432, 434 and 436 respectively. When all the values representative of errors in the directions of x, y and $\theta$ are reduced to the predetermined reference values, the AND gate 456 resets the flip-flop 424 and the analog switches 426, 428 and 430 are deenergized. Thus, the alignment sought is attained and the operation of the apparatus 100 comes to end.

In the above described embodiment, the x-scanning and the y-scanning are carried out alternately using a chopper 138 which shuts off a half of the total quantity of light emitted from a laser 102. This means a considerable loss of light. However, this disadvantage may be eliminated by modifying the above embodiment in the following manner:

A chopper is so made as to consist of two halves of different material, one half of which is of a light total-reflective material and the other half is composed of a light transmissive material. This chopper is arranged in place of the beam splitter 124 in FIG. 1, but with the same inclination as the beam splitter has in FIG. 1. In the same manner as in the above described embodiment, the chopper is rotated in synchronism with the rotary mirror 108 so that the beam 104 incident upon the total-reflective portion of the chopper may travel along the optical path 128 and the beam 104 incident upon the light transmissive portion may travel along the optical path 126.

According to this modification, only a single member acts both as the beam splitter 124 and as the chopper 138 used in the above embodiment while using more effectively the quantity of the light emitted from the laser 102 without reducing the effect attained by the above embodiment.

Figure 6:
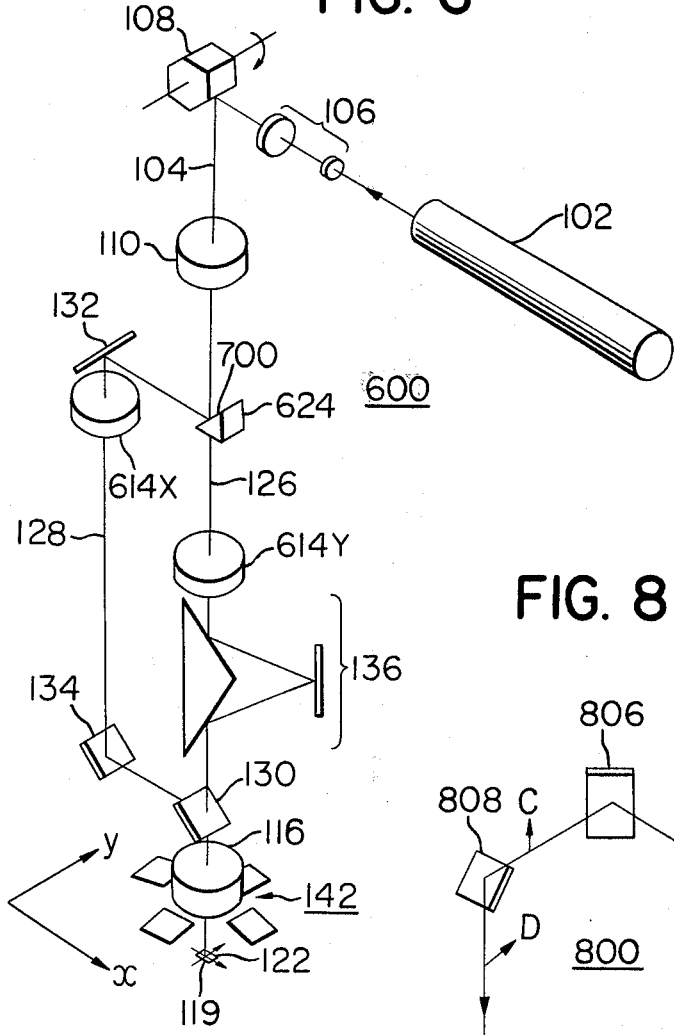
FIG. 6 is a view similar to FIG. 1 and showing another embodiment of the invention.

FIG. 6 illustrates a second embodiment of alignment apparatus according to the invention which enables full use of light and in which mechanical movement of a chopper is excluded.

In the alignment apparatus 600 shown in FIG. 6, the chopper 138 (FIG. 1) is not used, but a beam dividing mirror 624 is used instead. In FIG. 6, the parts which are the same as those in FIG. 1 are designated by the same reference characters as used in FIG. 1. For the sake of simplification of explanation, a detailed description will be made hereinafter only of the portion of the embodiment different from the first embodiment shown in FIG. 1.

Figure 7:
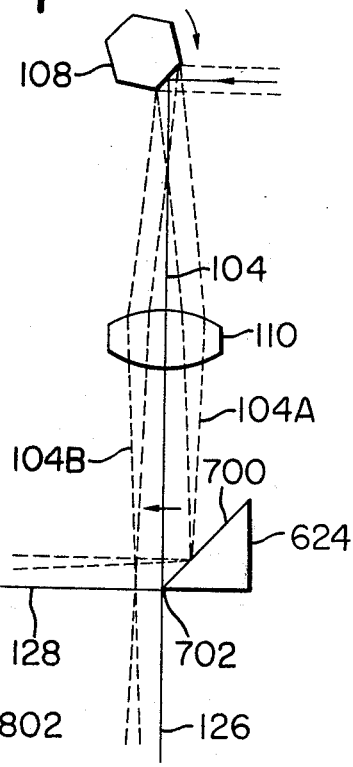
FIG. 7 is an explanatory view of the beam dividing mirror used in the alignment apparatus shown in FIG. 6.

The laser beam 104 is deflected by the rotary mirror 108 and then transformed by an $f\theta$ lens 110 into a spot moving linearly at a uniform velocity which is incident upon the beam dividing mirror 624. As can be seen from FIG. 7, the beam dividing mirror is disposed at the right side half of the optical axis as viewed in the drawing, so that a beam 104A incident upon the right side of the optical axis is reflected by the mirror surfaces 700 to the left as viewed in the drawing, whereas a beam 104B incident on the left side of the optical axis is allowed to continue travelling straight. The focal point at the object side of the fθ lens 110 is positioned at the surface of the rotary mirror 108 and the focal point at the image side is positioned at the position 702 at which the mirror surface 700 of the beam dividing mirror 624 contacts the optical axis.

Referring again to FIG. 6, as the rotary mirror 108 rotates, the beam 104 is gradually deflected. At the beginning of rotation of the rotary mirror 108, the beam 104 is deflected toward the mirror surface 700 of the beam dividing mirror 624 which reflects it to the left. The beam 104 thus reflected by the mirror surface 700 enters an objective lens 116 through a mirror 132, a lens 614X, a mirror 134 and a beam splitter 130. The objective lens 116 focuses the incident beam on an alignment mark 122. As the rotation of the rotary mirror 108 is further advanced, the beam 104 is increasingly deflected to the left and becomes no longer incident upon the mirror surface 700. Therefore, this beam, indicated by 126, runs straight downward. Like the above mentioned beam which travels along the optical path 128, the beam 126 is focused on the mark 122, but after passing through a lens 614Y, an image rotator 136 and a beam splitter 130. The optical path 128 and the optical path 126 are equal in length. The image rotator 136 rotates the beam along the path 126 by 90°. Therefore, the beam travelling along the optical path 128 scans the mark 122 in the direction of x and the beam travelling along the optical path 126 scans it in the direction of y. The lenses 614X and 116 as well as the lenses 614Y and 116 constitute relay systems, respectively.

In this manner, according to the second embodiment, the quantity of the light 104 emitted from the laser 102 is fully and effectively used for scanning.

After detection, the signal is processed and used for the desired alignment employing essentially the same signal processing system and servo system as previously described in connection with the first embodiment, and therefore an explanation thereof is omitted.

Figure 8:
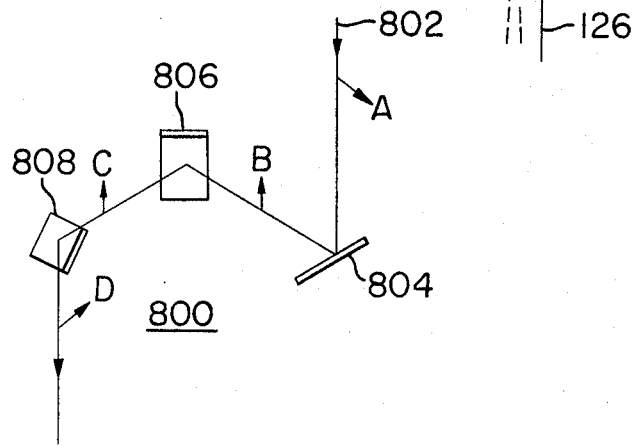
FIG. 8 is a diagrammatic view of another example of an image rotator useful for the alignment apparatus of the invention.

While in the second embodiment the image rotator 136 has been particularly shown to comprise three mirrors and to be disposed between the lens 614Y and the beam splitter 130, there may be used another type of image rotator. One example of other useful image rotators is shown in FIG. 8. The image rotator 800 shown in FIG. 8 is an example of a type of image rotator in which an odd number of mirror surfaces is used, and these mirror surfaces are so arranged that the optical axis of a beam before incidence and that after emergence are in the same direction, while only the direction of the image is turned by 90°.

Referring to FIG. 8, there is shown a beam incident upon the image rotator 800. The arrow A indicates the image direction of the incident beam 802. Mirrors 804, 806 and 808 reflect the beam successively to form a beam with the image direction of arrow B, a beam with the image direction of arrow C and a beam with the image direction D in this order. Therefore, it will be understood that the image direction indicated by the arrow D has been rotated by 90° relative to the arrow A. When a type of image rotator such as the image rotator 800 is used in place of the image rotator 136 in the alignment apparatus 600 (FIG. 6), the lens 614Y may be interposed between the mirrors 804 and 806 or between the mirrors 806 and 808. Also, if desired, it may be disposed before the mirror 804 or after the mirror 808. Compared with the image rotator 136 shown in FIG. 6, the image rotator 800 has an advantage in that the image rotator per se does not require so long an optical length. Accordingly, it can be used also for the case wherein a relatively short optical length is available (which cannot be occupied only by an image rotator itself).

As already mentioned, the second embodiment allows full and effective use of light. Moreover, since it is no longer necessary to use a chopper 138, the apparatus can be freed from any adverse effect of mechanical vibrations caused by rotation of the chopper.

While the first embodiment needs two neighboring surfaces of the rotary mirror 108 to effect one x-y scanning, in the case of the second embodiment, there is necessary only one surface therefor. According to the second embodiment, the frequency of x-y scanning is twice that in the first embodiment if the number of surfaces of the rotary mirror 108 as well as its rotational speed are entirely the same for both the embodiments. Accordingly, the response time required to detect the alignment position is halved.

Disadvantages of the second embodiment are found in that two lenses 614X and 614Y must be used instead of a single lens 114 (FIG. 1), and in that the length of scanning (scanning range) over which the spot 119 can scan a wafer in the directions of x and y is reduced by half because the sweeping width of the beam is divided in half by the beam dividing mirror 624.

While the invention has been particularly shown and described with reference to preferred embodiments thereof, it will be understood by those skilled in the art that the foregoing and other changes in form and details can be made therein without departing from the spirit and scope of the invention.

We claim:

1. An apparatus for determining the positional relationship between two objects, comprising a reference mark on each object, each reference mark having first and second parallel portions and having third and fourth parallel portions, the first, second, third and fourth portions being arranged such that the first and second portions on one object are spaced a predetermined distance from corresponding first and second portions on the other object and the third and fourth portions of one object are spaced a predetermined distance from corresponding third and fourth portions on the other object when the two objects are in a predetermined positional relationship, means for scanning a beam of light past the first and second portions in a first direction, means for thereafter scanning a beam of light past the third and fourth portions in a second direction different from the first direction, means for converting light received from each of the portions during each scan to corresponding electrical signals, and means responsive to the electrical signals for separately determining the relative positions of the two objects in the first and second scan directions, the determining means comprising pulse generating means for producing first, second, third and fourth pulse trains corresponding, respectively, to a first time interval between the electrical signals produced by light received from said first portions, a second time interval between the electrical signals produced by light received from said second portions, a third time interval between the electrical signals produced by light received from said third portions and a fourth time interval between the electrical signals produced by light received from said fourth portions, reversible counter means for counting the first pulse train in one direction and for counting the second pulse train in the opposite direction to determine the difference between the first and second time intervals and for counting the third pulse train in one direction and for counting the fourth pulse train in the opposite direction to determine the difference between the third and fourth time intervals.

2. The apparatus of claim 1 further comprising means for moving the position of one object with respect to the other to position the objects in said predetermined positional relationship, the determining means controlling said moving means.

3. The apparatus of claim 1, wherein the reference marks are quadrilateral.

4. The apparatus of claim 1 wherein the determining means comprises means for generating synchronizing signals in response to said scanning, a first latch circuit connected to the reversible counter means, and a second latch circuit connected to the reversible counter means, the synchronizing signals operable to clear said counter means and to control the first and second latch circuits to store the contents of the counter means when the contents of said counter means correspond to the difference between the first and second time intervals and the difference between the third and fourth time intervals, respectively.

5. The apparatus of claim 1, wherein said means for scanning in said first direction and said means for scanning in said second direction comprises means for sweeping the beam repetitively, and means for dividing the swept beam into first and second parts, the first part being employed to scan in said first direction and the second part being employed to scan in said second direction.

6. The apparatus of claim 5, wherein said means for scanning in said first direction and said means for scanning in said second direction further comprises means for alternately blocking the light from said first and second parts.

7. The apparatus of claim 1, wherein the scanning directions are orthogonal.

8. The apparatus of claim 1, wherein substantially all of the light from a single beam is first utilized in scan in the first direction and is then utilized in a scan in the second direction.

9. The apparatus of claim 1, including means for directing said light along a first path during the scan in the first direction and for directing said light along a second path during the scan in the second direction.

10. The apparatus of claim 9, wherein an image rotator is interposed in one of said paths.

11. The apparatus of claim 1, wherein when the two objects have a predetermined positional relationship, the reference mark of one object fits within the reference mark of the other object.

12. The apparatus of claim 11, wherein the reference mark of one object and the reference mark of said other object have similar shapes.

13. The apparatus of claim 12, wherein when the two objects have said predetermined positional relationship, second reference marks on each object have a relationship to one another similar to the relationship between the first-mentioned reference marks.

14. The apparatus of claim 13, wherein said second reference marks have similar shapes to the first-mentioned reference marks.

15. The apparatus of claim 1, wherein each light beam is scanned at a uniform rate.

16. The apparatus of claim 1, wherein the means for converting comprises photoelectric means for receiving light scattered from said portions.

* * * * *